US011537055B2

(12) United States Patent
Smirnov

(10) Patent No.: US 11,537,055 B2
(45) Date of Patent: Dec. 27, 2022

(54) LITHOGRAPHIC APPARATUS, METROLOGY APPARATUS, OPTICAL SYSTEM AND METHOD

(71) Applicant: ASML Holding N.V., Veldhoven (NL)

(72) Inventor: Stanislav Smirnov, Danbury, CT (US)

(73) Assignee: ASML Holding N.V., Veldhoven (NL)

( * ) Notice: Subject to any disclaimer, the term of this patent is extended or adjusted under 35 U.S.C. 154(b) by 0 days.

(21) Appl. No.: 17/438,328

(22) PCT Filed: Feb. 28, 2020

(86) PCT No.: PCT/EP2020/055227
§ 371 (c)(1),
(2) Date: Sep. 10, 2021

(87) PCT Pub. No.: WO2020/182488
PCT Pub. Date: Sep. 17, 2020

(65) Prior Publication Data
US 2022/0179330 A1 Jun. 9, 2022

Related U.S. Application Data

(60) Provisional application No. 62/818,054, filed on Mar. 13, 2019.

(51) Int. Cl.
*G03F 9/00* (2006.01)
(52) U.S. Cl.
CPC .......... *G03F 9/7034* (2013.01); *G03F 9/7065* (2013.01); *G03F 9/7096* (2013.01)
(58) Field of Classification Search
CPC .... G03F 9/7034; G03F 9/7065; G03F 9/7096; G02B 5/30; G02B 5/3066
See application file for complete search history.

(56) References Cited

U.S. PATENT DOCUMENTS

2003/0161029 A1\* 8/2003 Kurtz .................. G02B 5/3058
359/290
2004/0165169 A1 8/2004 Teunissen et al.
(Continued)

FOREIGN PATENT DOCUMENTS

CN 100559278 C 11/2009
EP 1408355 A1 \* 4/2004 ........... G02B 5/3066
(Continued)

OTHER PUBLICATIONS

International Search Report and Written Opinion of the International Searching Authority directed to related International Patent Application No. PCT/EP2020/055227, dated Jun. 16, 2020; 10 pages.

*Primary Examiner* — Peter B Kim
(74) *Attorney, Agent, or Firm* — Sterne, Kessler, Goldstein & Fox P.L.L.C.

(57) ABSTRACT

A method to reduce sensitivity of a level sensor, arranged to measure a height of a substrate, to variations of a property of an optical component in the level sensor includes directing a beam of radiation toward a diffractive element and directing the beam, via an optical system, to a first reflective element at a first angle of incidence. The beam has a first polarization and a second polarization that is perpendicular to the first polarization. The first reflective element reflects the beam toward a second reflective element at a second angle of incidence causing the beam to impinge on the substrate. The first and second angles of incidence are selected to reduce variations of a ratio of intensities of the first polarization to the second polarization of the beam imparted by a property of a layer of at least one of the first and second reflective elements.

20 Claims, 8 Drawing Sheets

(56) References Cited

U.S. PATENT DOCUMENTS

| | | |
|---|---|---|
| 2005/0152046 A1 | 7/2005 | Gruner et al. |
| 2010/0007953 A1 | 1/2010 | Pan |
| 2010/0062351 A1 | 3/2010 | Hidaka |
| 2011/0164229 A1 | 7/2011 | Staals et al. |
| 2012/0099107 A1 | 4/2012 | Ahn et al. |
| 2013/0077079 A1 | 3/2013 | Den Boef et al. |
| 2013/0242304 A1 | 9/2013 | Hidaka |
| 2015/0346609 A1 | 12/2015 | Den Boef |

FOREIGN PATENT DOCUMENTS

| | | |
|---|---|---|
| EP | 1 439 428 A2 | 7/2004 |
| WO | WO 2017/060014 A1 | 4/2017 |
| WO | WO 2019/197111 A1 | 10/2019 |

* cited by examiner

US 11,537,055 B2

LITHOGRAPHIC APPARATUS, METROLOGY APPARATUS, OPTICAL SYSTEM AND METHOD

CROSS-REFERENCE TO RELATED APPLICATIONS

This application claims priority of U.S. Provisional Patent Application No. 62/818,054, which was filed on Mar. 13, 2019, and which is incorporated herein in its entirety by reference.

FIELD

The present disclosure relates to metrology apparatuses and systems, for example, position sensors for lithographic apparatuses and systems.

BACKGROUND

A lithographic apparatus is a machine that applies a desired pattern onto a substrate, usually onto a target portion of the substrate. A lithographic apparatus can be used, for example, in the manufacture of integrated circuits (ICs) or other devices designed to be functional. In that instance, a patterning device, which is alternatively referred to as a mask or a reticle, may be used to generate a circuit pattern to be formed on an individual layer of the device designed to be functional. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti parallel to this direction. It is also possible to transfer the pattern from the patterning device to the substrate by imprinting the pattern onto the substrate.

Manufacturing devices, such as semiconductor devices, typically involves processing a substrate (e.g., a semiconductor wafer) using a number of fabrication processes to form various features and often multiple layers of the devices. Such layers and/or features are typically manufactured and processed using, e.g., deposition, lithography, etch, chemical-mechanical polishing, and ion implantation. Multiple devices may be fabricated on a plurality of dies on a substrate and then separated into individual devices. This device manufacturing process may be considered a patterning process. A patterning process involves a pattern transfer step, such as optical and/or nanoimprint lithography using a lithographic apparatus, to provide a pattern on a substrate and typically, but optionally, involves one or more related pattern processing steps, such as resist development by a development apparatus, baking of the substrate using a bake tool, etching the pattern by an etch apparatus, etc. Further, one or more metrology processes are involved in the patterning process.

Metrology processes are used at various steps during a patterning process to monitor and/or control the process. For example, metrology processes are used to measure one or more characteristics of a substrate, such as a relative location (e.g., registration, overlay, alignment, etc.) or dimension (e.g., line width, critical dimension (CD), thickness, etc.) of features formed on the substrate during the patterning process, such that, for example, the performance of the patterning process can be determined from the one or more characteristics. If the one or more characteristics are unacceptable (e.g., out of a predetermined range for the characteristic(s)), one or more variables of the patterning process may be designed or altered, e.g., based on the measurements of the one or more characteristics, such that substrates manufactured by the patterning process have an acceptable characteristic(s).

With the advancement of lithography and other patterning process technologies, the dimensions of functional elements have continually been reduced while the amount of the functional elements, such as transistors, per device has been steadily increased over decades. In the meanwhile, the requirement of accuracy in terms of overlay, critical dimension (CD), etc. has become more and more stringent. Error, such as error in overlay, error in CD, etc., will inevitably be produced in the patterning process. For example, imaging error may be produced from optical aberration, patterning device heating, patterning device error, and/or substrate heating and can be characterized in terms of, e.g., overlay, CD, etc. Additionally or alternatively, error may be introduced in other parts of the patterning process, such as in etch, development, bake, etc. and similarly can be characterized in terms of, e.g., overlay, CD, etc. The error may cause a problem in terms of the functioning of the device, including failure of the device to function or one or more electrical problems of the functioning device. Accordingly, it is desirable to be able to characterize one or more these errors and take steps to design, modify, control, etc. a patterning process to reduce or minimize one or more of these errors.

A metrology system is typically used to characterize errors produced by lithographic processes. A metrology system typically needs reproducible fabrication and arrangements of optical components to accurately measure positions of targets on a substrate. It is desirable for metrology systems that are engineered and manufactured the same should be able to produce measurements that are in agreement, or at least within some predetermined tolerance.

SUMMARY

In some embodiments, a method to reduce sensitivity of a level sensor, arranged to measure a height of a substrate, to variations of a property of an optical component in the level sensor comprises directing a beam of radiation toward a diffractive element and directing the beam, via an optical system, to a first reflective element at a first angle of incidence. The beam has a first polarization and a second polarization that is perpendicular to the first polarization. The first reflective element reflects the beam toward a second reflective element at a second angle of incidence so as to cause the beam to impinge on the substrate. The first and second angles of incidence are selected to reduce variations of a ratio of intensities of the first polarization to the second polarization of the beam imparted by a property of a layer of at least one of the first and second reflective elements.

In some embodiments, an optical system for directing a beam of radiation having a first polarization and a second polarization that is perpendicular to the first polarization comprises a diffractive element and first and second reflective elements. The diffractive element is configured to direct the beam in the optical system so as to cause the beam to impinge on the first reflective element at a first angle of incidence. The first reflective element is configured to reflect the beam toward the second reflective element at a second angle of incidence so as to cause the beam to impinge on a substrate. The first and second angles of incidence are selected to reduce variations of a ratio of intensities of the first polarization to the second polarization of the beam imparted by a property of a layer of at least one of the first and second reflective elements.

In some embodiments, a metrology system comprises a radiation source, an optical system, and a detector. The radiation source is configured to generate a beam of radiation having a first polarization and a second polarization that is perpendicular to the first polarization. The optical system is configured to direct the beam of radiation toward a substrate. The optical system comprises a diffractive element and first and second reflective elements. The diffractive element is configured to direct the beam in the optical system so as to cause the beam to impinge on the first reflective element at a first angle of incidence. The first reflective element is configured to reflect the beam toward the second reflective element at a second angle of incidence so as to cause the beam to impinge on the substrate. The first and second angles of incidence are selected to reduce variations of a ratio of intensities of the first polarization to the second polarization of the beam imparted by a property of a layer of at least one of the first and second reflective elements. The detector is configured to receive radiation scattered by the substrate and generate a signal based on the received radiation. The signal comprises information of a height of the substrate.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

Figure 1A:
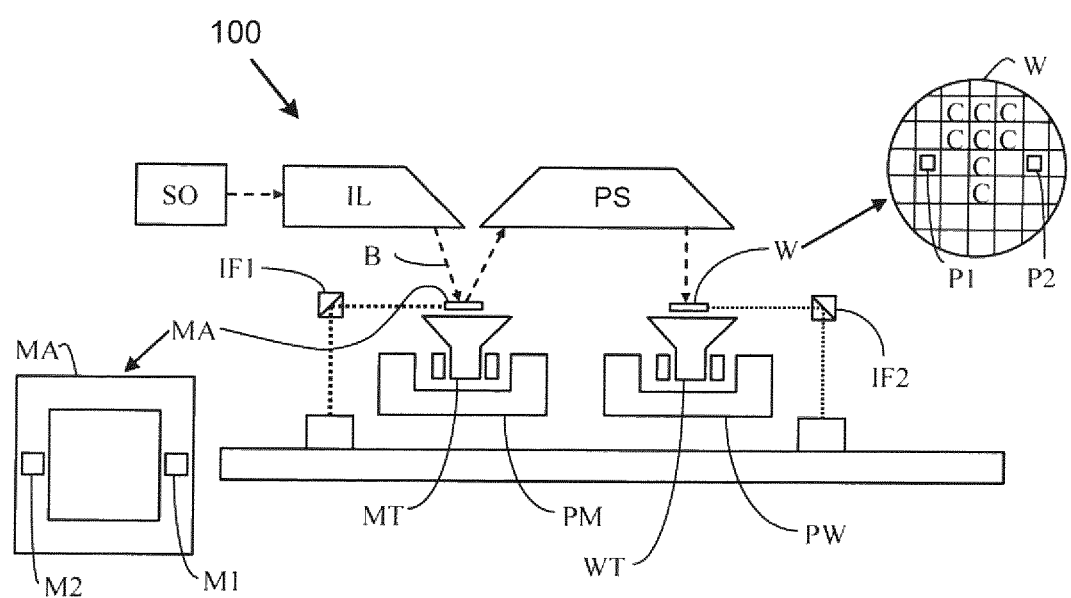
FIG. 1A shows a schematic of a reflective lithographic apparatus, according to some embodiments.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. Additionally, generally, the left-most digit(s) of a reference number identifies the drawing in which the reference number first appears. Unless otherwise indicated, the drawings provided throughout the disclosure should not be interpreted as to-scale drawings.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Spatially relative terms, such as "beneath," "below," "lower," "above," "on," "upper" and the like, can be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus can be otherwise oriented (rotated 90 degrees or at other orientations) and the spatially relative descriptors used herein may likewise be interpreted accordingly.

The term "about" can be used herein to indicate the value of a given quantity that can vary based on a particular technology. Based on the particular technology, the term "about" can indicate a value of a given quantity that varies within, for example, 10-30% of the value (e.g., ±10%, ±20%, or ±30% of the value).

Embodiments of the present disclosure can be implemented in hardware, firmware, software, or any combination thereof. Embodiments of the present disclosure may also be implemented as instructions stored on a machine-readable medium, which can be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, and/or instructions can be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present disclosure can be implemented.

Example Lithographic Systems

Figure 1B:
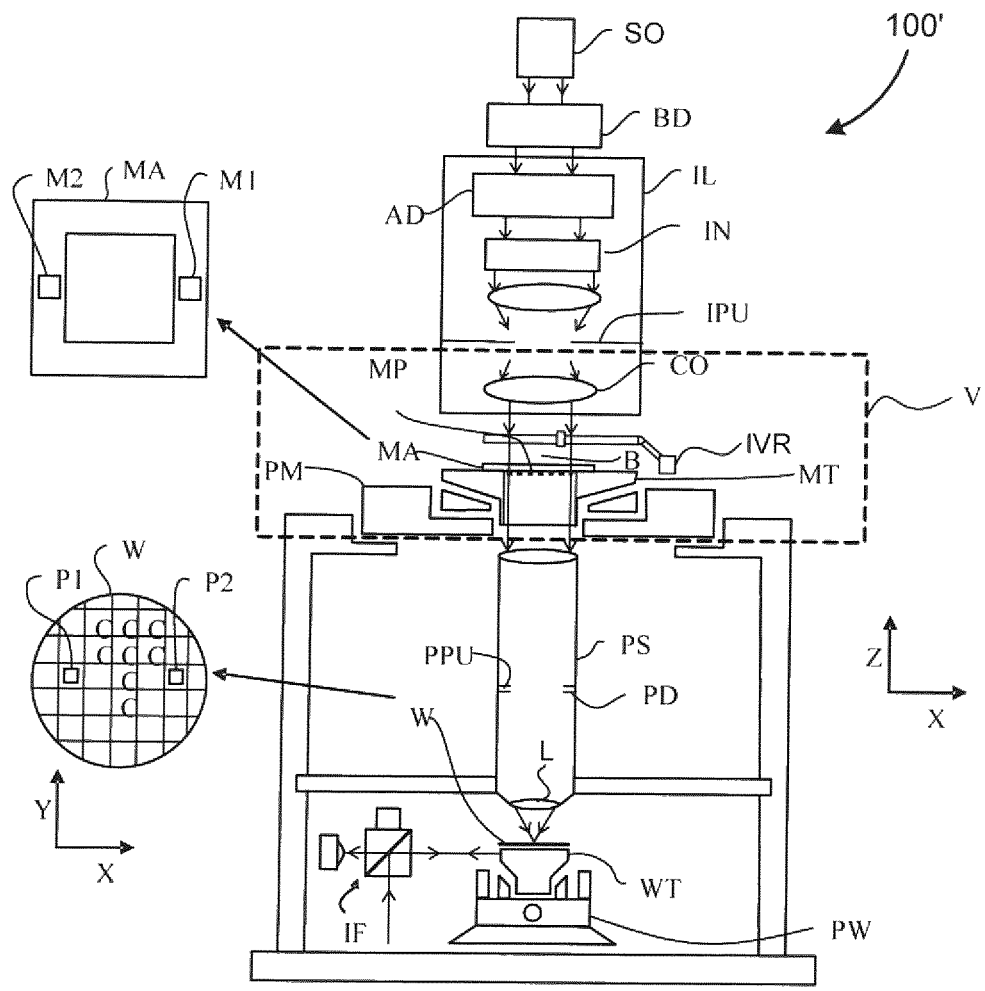
FIG. 1B shows a schematic of a transmissive lithographic apparatus, according to some embodiments.

FIGS. 1A and 1B show schematics of a lithographic apparatus 100 and lithographic apparatus 100', respectively, according to some embodiments. In some embodiments, lithographic apparatus 100 and lithographic apparatus 100' each include the following: an illumination system (illuminator) IL configured to condition a radiation beam B (for example, deep ultra violet or extreme ultra violet radiation); a support structure (for example, a mask table) MT configured to support a patterning device (for example, a mask, a reticle, or a dynamic patterning device) MA and connected to a first positioner PM configured to accurately position the patterning device MA; and, a substrate table (for example, a wafer table) WT configured to hold a substrate (for example, a resist coated wafer) W and connected to a second positioner PW configured to accurately position the substrate W. Lithographic apparatus 100 and 100' also have a projection system PS configured to project a pattern imparted to the radiation beam B by patterning device MA onto a target portion (for example, comprising one or more dies) C of the substrate W. In lithographic apparatus 100, the patterning device MA and the projection system PS are reflective. In lithographic apparatus 100', the patterning device MA and the projection system PS are transmissive.

The illumination system IL can include various types of optical components, such as refractive, reflective, catadioptric, magnetic, electromagnetic, electrostatic, or other types of optical components, or any combination thereof, for directing, shaping, or controlling the radiation beam B.

The support structure MT holds the patterning device MA in a manner that depends on the orientation of the patterning device MA with respect to a reference frame, the design of at least one of the lithographic apparatus 100 and 100', and other conditions, such as whether or not the patterning device MA is held in a vacuum environment. The support structure MT can use mechanical, vacuum, electrostatic, or other clamping techniques to hold the patterning device MA. The support structure MT can be a frame or a table, for example, which can be fixed or movable, as required. By using sensors, the support structure MT can ensure that the patterning device MA is at a desired position, for example, with respect to the projection system PS.

The term "patterning device" MA should be broadly interpreted as referring to any device that can be used to impart a radiation beam B with a pattern in its cross-section, such as to create a pattern in the target portion C of the substrate W. The pattern imparted to the radiation beam B can correspond to a particular functional layer in a device being created in the target portion C to form an integrated circuit.

The patterning device MA can be transmissive (as in lithographic apparatus 100' of FIG. 1B) or reflective (as in lithographic apparatus 100 of FIG. 1A). Examples of patterning devices MA include reticles, masks, programmable mirror arrays, and programmable LCD panels. Masks are well known in lithography, and include mask types such as binary, alternating phase shift, and attenuated phase shift, as well as various hybrid mask types. An example of a programmable mirror array employs a matrix arrangement of small mirrors, each of which can be individually tilted so as to reflect an incoming radiation beam in different directions. The tilted mirrors impart a pattern in the radiation beam B which is reflected by a matrix of small mirrors.

The term "projection system" PS can encompass any type of projection system, including refractive, reflective, catadioptric, magnetic, electromagnetic and electrostatic optical systems, or any combination thereof, as appropriate for the exposure radiation being used, or for other factors, such as the use of an immersion liquid on the substrate W or the use of a vacuum. A vacuum environment can be used for EUV or electron beam radiation since other gases can absorb too much radiation or electrons. A vacuum environment can therefore be provided to the whole beam path with the aid of a vacuum wall and vacuum pumps.

Lithographic apparatus 100 and/or lithographic apparatus 100' can be of a type having two (dual stage) or more substrate tables WT (and/or two or more mask tables). In such "multiple stage" machines, the additional substrate tables WT can be used in parallel, or preparatory steps can be carried out on one or more tables while one or more other substrate tables WT are being used for exposure. In some situations, the additional table may not be a substrate table WT.

Referring to FIGS. 1A and 1B, the illuminator IL receives a radiation beam from a radiation source SO. The source SO and the lithographic apparatus 100, 100' can be separate physical entities, for example, when the source SO is an excimer laser. In such cases, the source SO is not considered to form part of the lithographic apparatus 100 or 100', and the radiation beam B passes from the source SO to the illuminator IL with the aid of a beam delivery system BD (in FIG. 1B) including, for example, suitable directing mirrors and/or a beam expander. In other cases, the source SO can be an integral part of the lithographic apparatus 100, 100'— for example when the source SO is a mercury lamp. The source SO and the illuminator IL, together with the beam delivery system BD, if required, can be referred to as a radiation system.

The illuminator IL can include an adjuster AD (in FIG. 1B) for adjusting the angular intensity distribution of the radiation beam. Generally, at least the outer and/or inner radial extent (commonly referred to as "σ-outer" and "σ-inner," respectively) of the intensity distribution in a pupil plane of the illuminator can be adjusted. In addition, the illuminator IL can comprise various other components (in FIG. 1B), such as an integrator IN and a condenser CO. The illuminator IL can be used to condition the radiation beam B to have a desired uniformity and intensity distribution in its cross section.

Referring to FIG. 1A, the radiation beam B is incident on the patterning device (for example, mask) MA, which is held on the support structure (for example, mask table) MT, and is patterned by the patterning device MA. In lithographic apparatus 100, the radiation beam B is reflected from the patterning device (for example, mask) MA. After being reflected from the patterning device (for example, mask) MA, the radiation beam B passes through the projection system PS, which focuses the radiation beam B onto a target portion C of the substrate W. With the aid of the second positioner PW and position sensor IF2 (for example, an interferometric device, linear encoder, or capacitive sensor), the substrate table WT can be moved accurately (for example, so as to position different target portions C in the path of the radiation beam B). Similarly, the first positioner PM and another position sensor IF1 can be used to accurately position the patterning device (for example, mask) MA with respect to the path of the radiation beam B. Patterning device (for example, mask) MA and substrate W can be aligned using mask alignment marks M1, M2 and substrate alignment marks P1, P2.

Referring to FIG. 1B, the radiation beam B is incident on the patterning device (for example, mask MA), which is held on the support structure (for example, mask table MT), and is patterned by the patterning device. Having traversed the mask MA, the radiation beam B passes through the projection system PS, which focuses the beam onto a target portion C of the substrate W. The projection system has a pupil PPU conjugate to an illumination system pupil IPU. Portions of radiation emanate from the intensity distribution at the illumination system pupil IPU and traverse a mask pattern without being affected by diffraction at a mask pattern and create an image of the intensity distribution at the illumination system pupil IPU.

With the aid of the second positioner PW and position sensor IF (for example, an interferometric device, linear encoder, or capacitive sensor), the substrate table WT can be moved accurately (for example, so as to position different target portions C in the path of the radiation beam B). Similarly, the first positioner PM and another position sensor (not shown in FIG. 1B) can be used to accurately position the mask MA with respect to the path of the radiation beam B (for example, after mechanical retrieval from a mask library or during a scan).

In some embodiments, movement of the mask table MT can be realized with the aid of a long-stroke module (coarse positioning) and a short-stroke module (fine positioning), which form part of the first positioner PM. Similarly, movement of the substrate table WT can be realized using a long-stroke module and a short-stroke module, which form part of the second positioner PW. In the case of a stepper (as opposed to a scanner), the mask table MT can be connected to a short-stroke actuator only or can be fixed. Mask MA and substrate W can be aligned using mask alignment marks M1, M2, and substrate alignment marks P1, P2. Although the substrate alignment marks (as illustrated) occupy dedicated target portions, they can be located in spaces between target portions (known as scribe-lane alignment marks). Similarly, in situations in which more than one die is provided on the mask MA, the mask alignment marks can be located between the dies.

Mask table MT and patterning device MA can be in a vacuum chamber, where an in-vacuum robot IVR can be used to move patterning devices such as a mask in and out of vacuum chamber. Alternatively, when mask table MT and patterning device MA are outside of the vacuum chamber, an out-of-vacuum robot can be used for various transportation operations, similar to the in-vacuum robot IVR. Both the in-vacuum and out-of-vacuum robots need to be calibrated for a smooth transfer of any payload (e.g., mask) to a fixed kinematic mount of a transfer station.

The lithographic apparatus 100 and 100' can be used in at least one of the following modes:

1. In step mode, the support structure (for example, mask table) MT and the substrate table WT are kept essentially stationary, while an entire pattern imparted to the radiation beam B is projected onto a target portion C at one time (i.e., a single static exposure). The substrate table WT is then shifted in the X and/or Y direction so that a different target portion C can be exposed.

2. In scan mode, the support structure (for example, mask table) MT and the substrate table WT are scanned synchronously while a pattern imparted to the radiation beam B is projected onto a target portion C (i.e., a single dynamic exposure). The velocity and direction of the substrate table WT relative to the support structure (for example, mask table) MT can be determined by the (de-)magnification and image reversal characteristics of the projection system PS.

3. In another mode, the support structure (for example, mask table) MT is kept substantially stationary holding a programmable patterning device, and the substrate table WT is moved or scanned while a pattern imparted to the radiation beam B is projected onto a target portion C. A pulsed radiation source SO can be employed and the programmable patterning device is updated as required after each movement of the substrate table WT or in between successive radiation pulses during a scan. This mode of operation can be readily applied to maskless lithography that utilizes a programmable patterning device, such as a programmable mirror array.

Combinations and/or variations on the described modes of use or entirely different modes of use can also be employed.

In some embodiments, lithographic apparatus 100 includes an extreme ultraviolet (EUV) source, which is configured to generate a beam of EUV radiation for EUV lithography. In general, the EUV source is configured in a radiation system, and a corresponding illumination system is configured to condition the EUV radiation beam of the EUV source.

Figure 2:
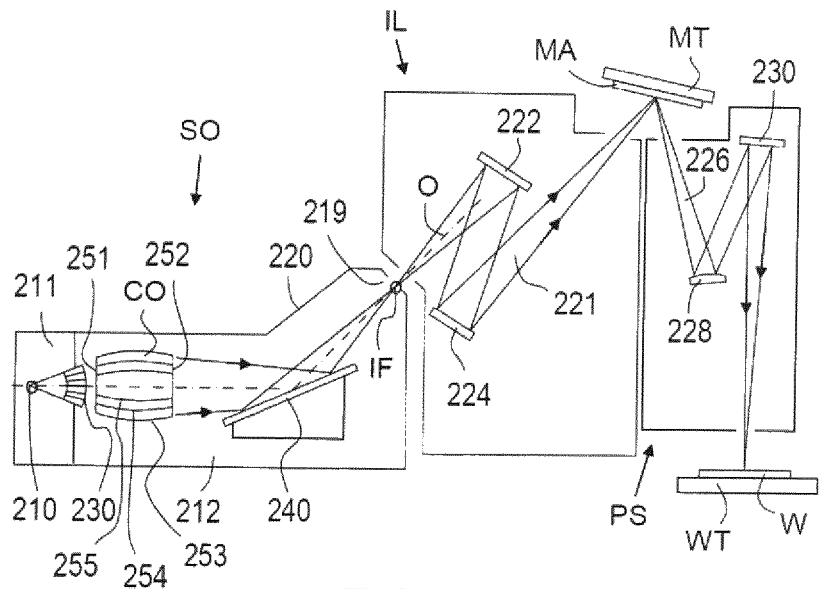
FIG. 2 shows a detailed schematic of a reflective lithographic apparatus, according to some embodiments.

FIG. 2 shows the lithographic apparatus 100 in more detail, including the source collector apparatus SO, the illumination system IL, and the projection system PS. The source collector apparatus SO is constructed and arranged such that a vacuum environment can be maintained in an enclosing structure 220 of the source collector apparatus SO. An EUV radiation emitting plasma 210 can be formed by a discharge produced plasma source. EUV radiation can be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing an at least partially ionized plasma. Partial pressures of, for example, 10 Pa of Xe, Li, Sn vapor or any other suitable gas or vapor may be required for efficient generation of the radiation. In some embodiments, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 can include a channel structure. Contamination trap 230 can also include a gas barrier or a combination of a gas barrier and a channel structure. The contaminant trap or contaminant barrier 230 further indicated herein at least includes a channel structure, as known in the art.

The collector chamber 212 can include a radiation collector CO which can be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF. The virtual source point IF is commonly referred to as the intermediate focus, and the source collector apparatus is arranged such that the intermediate focus IF is located at or near an opening 219 in the enclosing structure 220. The virtual source point IF is an image of the radiation emitting plasma 210. Grating spectral filter 240 is used in particular for suppressing infra-red (IR) radiation.

Subsequently the radiation traverses the illumination system IL, which can include a facetted field mirror device 222 and a facetted pupil mirror device 224 arranged to provide a desired angular distribution of the radiation beam 221, at the patterning device MA, as well as a desired uniformity of radiation intensity at the patterning device MA. Upon reflection of the beam of radiation 221 at the patterning device MA, held by the support structure MT, a patterned beam 226 is formed and the patterned beam 226 is imaged by the projection system PS via reflective elements 228, 230 onto a substrate W held by the wafer stage or substrate table WT.

More elements than shown can generally be present in illumination optics unit IL and projection system PS. The grating spectral filter 240 can optionally be present, depending upon the type of lithographic apparatus. Further, there can be more mirrors present than those shown in the figures, for example there can be 1-6 additional reflective elements present in the projection system PS than shown in FIG. 2.

Collector optic CO, as illustrated in FIG. 2, is depicted as a nested collector with grazing incidence reflectors 253, 254 and 255, just as an example of a collector (or collector mirror). The grazing incidence reflectors 253, 254 and 255 are disposed axially symmetric around an optical axis O and a collector optic CO of this type is preferably used in combination with a discharge produced plasma source, often called a DPP source.

Exemplary Lithographic Cell

Figure 3:
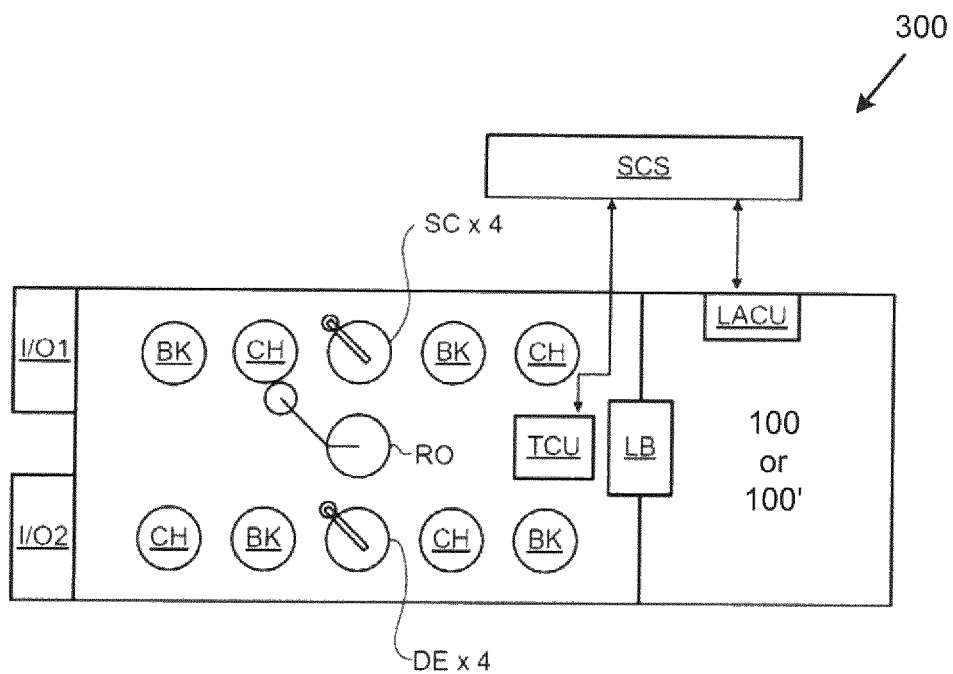
FIG. 3 shows a schematic of a lithographic cell, according to some embodiments.

FIG. 3 shows a schematic of a lithographic cell 300, also sometimes referred to a lithocell or cluster. Lithographic apparatus 100 or 100' can form part of lithographic cell 300. Lithographic cell 300 can also include apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

Exemplary Metrology System

Figure 4:
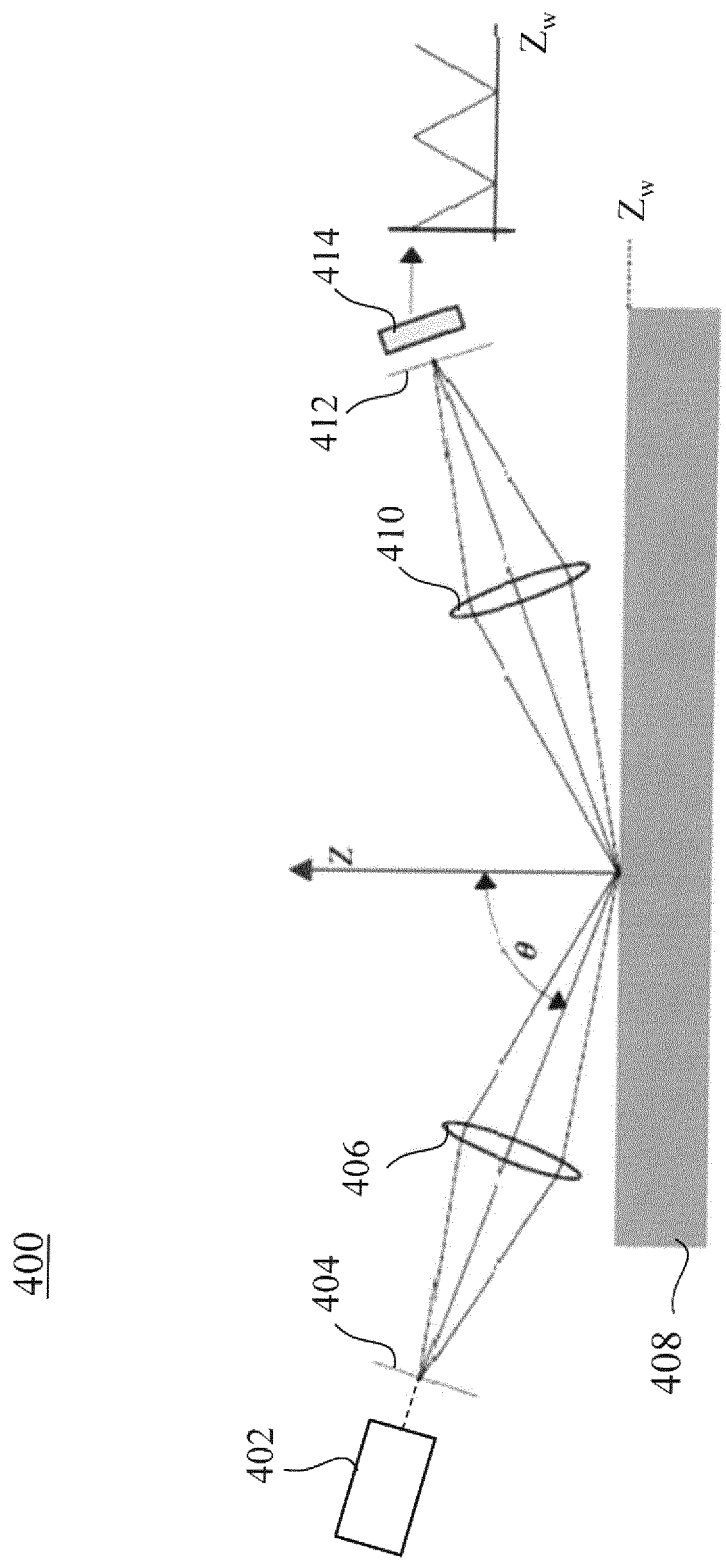
FIG. 4 shows a schematic of a metrology system, according to some embodiments.

FIG. 4 shows a schematic of a metrology system 400 that can be implemented as a part of lithographic apparatus 100 or 100', according to some embodiments. In some embodiments, metrology system 400 can be configured to measure height and height variations on a surface of substrate W. In some embodiments, metrology system 400 can be configured to detect positions of alignment marks on the substrate and to align the substrate with respect to the patterning device or other components of lithography apparatus 100 or 100' using the detected positions of the alignment marks.

In some embodiments, metrology system 400 can include a radiation source 402, a projection grating 404, a detection grating 412, and a detector 414. Radiation source 402 can be configured to provide an electromagnetic narrow band radiation beam having one or more passbands. In some embodiments, the one or more passbands can be within a spectrum of wavelengths between about 500 nm to about 900 nm. In another example, the one or more passbands can be discrete narrow passbands within a spectrum of wavelengths between about 500 nm to about 900 nm. In another example, radiation source 402 generates light within the ultraviolet (UV) spectrum of wavelengths between about 225 nm and 400 nm. Radiation source 402 can be further configured to provide one or more passbands having substantially constant center wavelength (CWL) values over a long period of time (e.g., over a lifetime of radiation source 402). Such configuration of radiation source 402 can help to prevent the shift of the actual CWL values from the desired CWL values, as discussed above, in current metrology systems. And, as a result, the use of constant CWL values can improve long-term stability and accuracy of metrology systems (e.g., metrology system 400) compared to the current metrology systems.

Projection grating 404 can be configured to receive the beam (or beams) of radiation generated from radiation source 402, and provide a projected image onto a surface of a substrate 408. Imaging optics 406 can be included between projection grating 404 and substrate 408, and can include one or more lenses, mirrors, gratings, etc. In some embodiment, imaging optics 406 is configured to focus the image projected from projection grating 404 onto the surface of substrate 408.

In some embodiments, projection grating 404 provides an image on the surface of substrate 408 at an angle θ relative to the surface normal. The image is reflected by the substrate surface and is re-imaged on detection grating 412. Detection grating 412 can be identical to projection grating 404. Imaging optics 410 can be included between substrate 408 and substrate detection grating 412, and can include one or more lenses, mirrors, gratings, etc. In some embodiment, imaging optics 410 is configured to focus the image reflected from the surface of substrate 408 onto detection grating 412. Due to the oblique incidence, a height variation ($Z_w$) in the surface of substrate 408 will shift the image projected by projection grating 404 when it is received by detection grating 412 over a distance (s) as given by the following equation (1):

$$s = 2Z_w \sin(\theta) \qquad (1)$$

In some embodiments, the shifted image of projection grating 404 is partially transmitted by detection grating 412 and the transmitted intensity, which is a periodic function of the image shift. This shifted image is received and measured by detector 414. Detector 414 can include a photodiode or photodiode array. Other examples of detector 414 include a CCD array. In some embodiments, detector 414 can be designed to measure wafer height variations as low as 1 nm based on the received image.

Exemplary Optical System

As mentioned earlier, a metrology system typically requires reproducible fabrication and arrangement of optical components to accurately make optical measurements. Additionally, identically engineered metrology systems should be able to produce measurements that are in agreement, or at least within some predetermined tolerance. However, tolerance limitations of optical component fabrication (e.g., a mirror needing precise thin film layer depositions) can adversely affect the performance of a metrology system. In the case of metrology systems for lithographic apparatuses, the required tolerances for some optical components may be difficult to achieve. The variations between seemingly identical optical components causes one metrology system to produce measurement results that are different from another metrology system using the same arrangement of optical components. It is desirable to reduce the variation between metrology systems, or machine-to-machine (M2M) variations, in order to improve accuracy and reliability of metrology systems.

Figure 5:
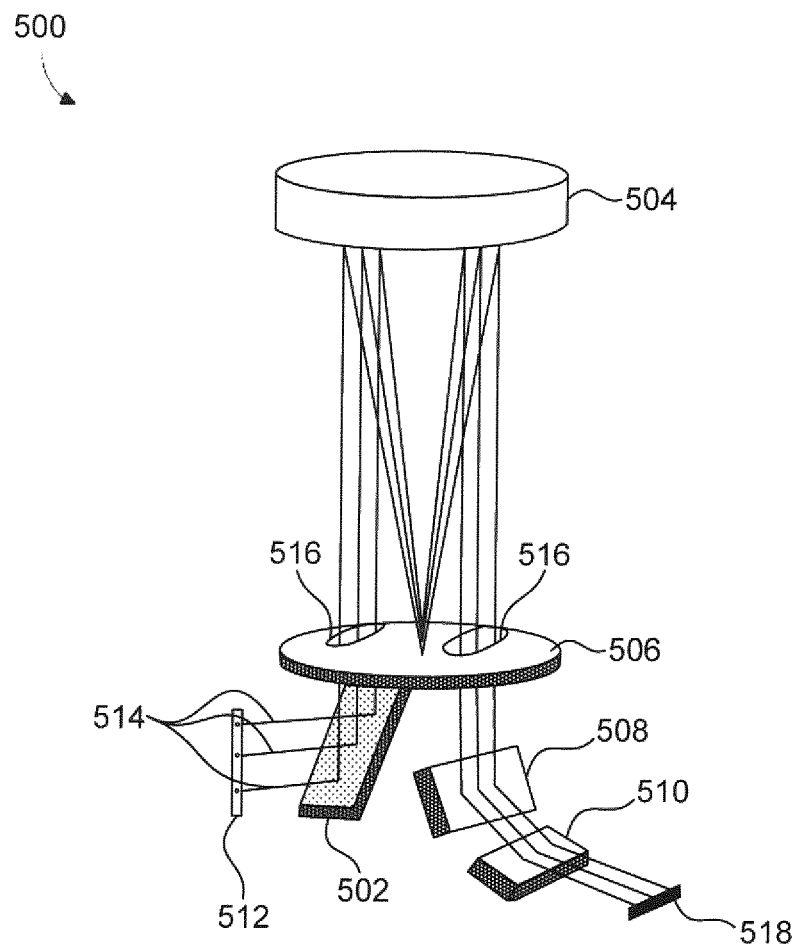
FIG. 5 shows a perspective schematic of optical system, according to some embodiments.

FIG. 5 shows a perspective schematic of optical system 500, according to some embodiments. In some embodiments, optical system 500 comprises a mirror 502, a mirror 504, a mirror 506, a mirror 508, and a mirror 510. Optical system 500 can be implemented in a metrology system, e.g., in place of imaging optics 406 in metrology system 400 (FIG. 4). In this scenario, projection grating 404 can be absorbed into imaging optics 406. Similarly, optical system 500 can be implemented in place of imaging optics 410 and optionally absorb detection grating 412. Therefore, in some embodiments, optical system 500 comprises a grating 512. In some embodiments, mirror 506 comprises one or more holes 516 configured to allow a beam of radiation 514 to pass through mirror 506.

In some embodiments, grating 512 is configured to direct beam of radiation 514 toward mirror 502. Grating 512 is further configured to diffract beam of radiation 514 such that beam of radiation 514 is decomposed into one or more diffraction orders and/or one or more wavelengths. Mirror 502 is configured to direct beam of radiation 514 from grating 512 and toward mirror 504. Mirror 504 is configured to direct beam of radiation 514 from mirror 502 and toward mirror 506. Mirror 506 is configured to receive beam of radiation 514 from mirror 504 and direct beam of radiation 514 back to mirror 504. Mirror 504 is further configured to receive beam of radiation 514 from mirror 506 and direct beam of radiation 514 toward mirror 508.

In some embodiments, when mirror 502 directs beam of radiation 514 from grating 512 toward mirror 504, mirror 502 is configured to do so by directing beam of radiation through one of the one or more holes 516 of mirror 506. In some embodiments, when mirror 504 directs beam of radiation 514 from mirror 506 toward mirror 508, mirror 504 is configured to do so by directing beam of radiation through one of the one or more holes 516 of mirror 506.

In some embodiments, mirror 508 is configured to receive beam of radiation 514, from mirror 504, at a first angle of incidence and direct beam of radiation 514 toward mirror 510. Mirror 510 is configured to receive, at a second angle of incidence, the beam reflected by mirror 508 and output beam of radiation 514, e.g., toward a substrate 518.

In some embodiments, the optical functions described above can be reversed. For example, if optical system 500 is used in a detection arrangement, radiation scattered from substrate 518 is the radiation that is input into optical system 500 (e.g., by impinging on mirror 510). An example detection arrangement will be discussed later in reference to FIG. 8.

In some embodiments, the first and second angles of incidence do not exceed approximately 80 degrees. In some embodiments, the first angle of incidence is between approximately 60 to 80 degrees. In some embodiments, the first angle of incidence is between approximately 45 to 60 degrees. In some embodiments, the second angle of incidence is between approximately 60 to 80 degrees. In some embodiments, the second angle of incidence is between approximately 45 to 60 degrees. In some embodiments, the first and second angles of incidence are the same or substantially similar.

In some embodiments, optical system 500 can be implemented in a metrology system, for example, to measure a height of a substrate (e.g., a level sensor). In this scenario, a detector in the metrology system is configured to receive radiation scattered from a substrate and generate a signal based on the received radiation. The signal can comprise information of a height of the substrate. The height can be defined as the position along an axis perpendicular to the substrate surface. A critical metric of M2M variations of level sensors is a so-called height process dependency (HPD). HPD refers to a level sensor's response characteristics (e.g., sensitivity) with respect to height from a substrate. The ratio of transmission, through an optical system (e.g., a lens, a lens objective, imaging optics, and the like), is a parameter that affects HPD, particularly the ratio of transmission for vertical and horizontal polarization—referred to as Rs/Rp when considered relative to the plane of substrate. More specifically, an optical system's Rs/Rp in turn is proportional to the product of Rs/Rp of, for example, two or more fold mirrors (e.g., mirror 508 and mirror 510). Rs/Rp of each mirror is a function of the angle of incidence of a beam impinging on each mirror. An important parameter for HPD is variation of Rs/Rp due to, for example, manufacturing errors. A primary contributor to HPD M2M variation of the optical system are the coating thickness errors of the mirrors, particularly at high angles of incidence. Due to the nature of reflection phenomena, Rs/Rp is dependent on angle of incidence and, for example, thickness and composition of a coating(s) on reflective surfaces—composition can affect optical properties, such as transmission and dielectric properties (e.g., permittivity, refractive index, and the like). Embodiments of the present invention provide structures and methods that allow a reduction of HPD M2M variation and increasing the accuracy and reliability of metrology systems.

Figure 6:
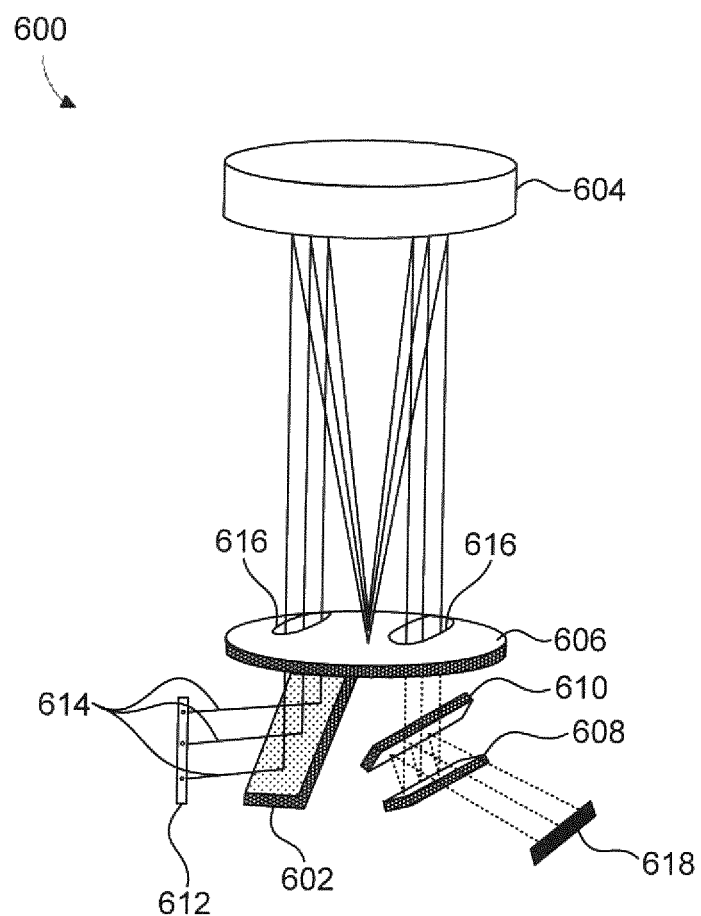
FIG. 6 shows a perspective schematic of optical system, according to some embodiments.

FIG. 6 shows a perspective schematic of optical system 600, according to some embodiments. In some embodiments, optical system 600 comprises a mirror 602, a mirror 604, a mirror 606, a mirror 608, and a mirror 610. Optical system 600 can be implemented in a metrology system, e.g., in place of imaging optics 406 in metrology system 400 (FIG. 4). In this scenario, projection grating 404 can be absorbed into imaging optics 406. Similarly, optical system 600 can be implemented in place of imaging optics 410 and optionally absorb detection grating 412. Therefore, in some embodiments, optical system 600 comprises a grating 612. In some embodiments, mirror 606 comprises one or more holes 616 configured to allow a beam of radiation 614 to pass through mirror 606.

In some embodiments, grating 612 is configured to direct beam of radiation 614 toward mirror 602. Grating 612 is further configured to diffract beam of radiation 614 such that beam of radiation 614 is decomposed into one or more diffraction orders and/or one or more wavelengths. Mirror 602 is configured to direct beam of radiation 614 from grating 612 and toward mirror 604. Mirror 604 is configured to direct beam of radiation 614 from mirror 602 and toward mirror 606. Mirror 606 is configured to receive beam of radiation 614 from mirror 604 and direct beam of radiation 614 back to mirror 604. Mirror 604 is further configured to receive beam of radiation 614 from mirror 606 and direct beam of radiation 614 toward mirror 608.

In some embodiments, when mirror 602 directs beam of radiation 614 from grating 612 toward mirror 604, mirror 602 is configured to do so by directing beam of radiation through one of the one or more holes 616 of mirror 606. In some embodiments, when mirror 604 directs beam of radiation 614 from mirror 606 toward mirror 608, mirror 604 is configured to do so by directing beam of radiation through one of the one or more holes 616 of mirror 606.

In some embodiments, mirror 608 is configured to receive beam of radiation 614, from mirror 604, at a first angle of incidence and direct beam of radiation 614 toward mirror 610. Mirror 610 is configured to receive, at a second angle of incidence, the beam reflected by mirror 608 and output beam of radiation 614, e.g., toward a substrate 618.

In some embodiments, the optical functions described above can be reversed. For example, if optical system 600 is used in a detection arrangement, radiation scattered from substrate 618 is the radiation that is input into optical system 600 (e.g., by impinging on mirror 610). An example detection arrangement will be discussed later, in reference to FIG. 8.

In some embodiments, optical system 600 can be implemented in a metrology system, for example, to measure a height of a substrate (e.g., a level sensor). In this scenario, a detector in the metrology system is configured to receive radiation scattered from a substrate and generate a signal based on the received radiation. The signal can comprise information of a height of the substrate.

It was mentioned earlier that the nature of reflection phenomena causes Rs/Rp to respond to angles of incidence, with large variations occurring at high angles of incidence. Therefore, in some embodiments, the first and second angles of incidence do not exceed approximately 45 degrees. In some embodiments, the first angle of incidence is between approximately 30 to 45 degrees. In some embodiments, the first angle of incidence is between approximately 10 to 30 degrees. In some embodiments, the second angle of incidence is between approximately 30 to 45 degrees. In some embodiments, the second angle of incidence is between approximately 10 to 30 degrees. In some embodiments, the first and second angles of incidence are the same or substantially similar. In some embodiments, mirror 608 and mirror 610 are arranged such that beam of radiation 614 received by mirror 608 crosses beam of radiation 614 reflected by mirror 610. In this scenario, the sum of the first and second angles of incidence is less than 90 degrees. In an alternative description, mirror 608 and mirror 610 are arranged such that beam of radiation 614 received by mirror 608 is folded onto beam of radiation 614 reflected by mirror 610. Embodiments using reduced angles of incidence reduce the sensitivity of optical systems, which in turn can counteract the sensitivities arising from errors in fabrication of the mirrors. A significant advantage of the structures and methods described herein is that Rs/Rp variations can be reduced without tightening coating tolerances of the mirrors, which in turn provides significant time and cost advantages in the production, implementation, and maintenance of optical systems.

A skilled artisan will appreciate that mirrors in optical system 500 or optical system 600 may be removed, added, or rearranged while still achieving the results and advantages described herein. For example, the arrangements of mirror 608 and mirror 610 can be maintained as described above while the arrangement of the other mirrors that deliver beam of radiation 614 to mirror 608 is altered.

Figure 7:
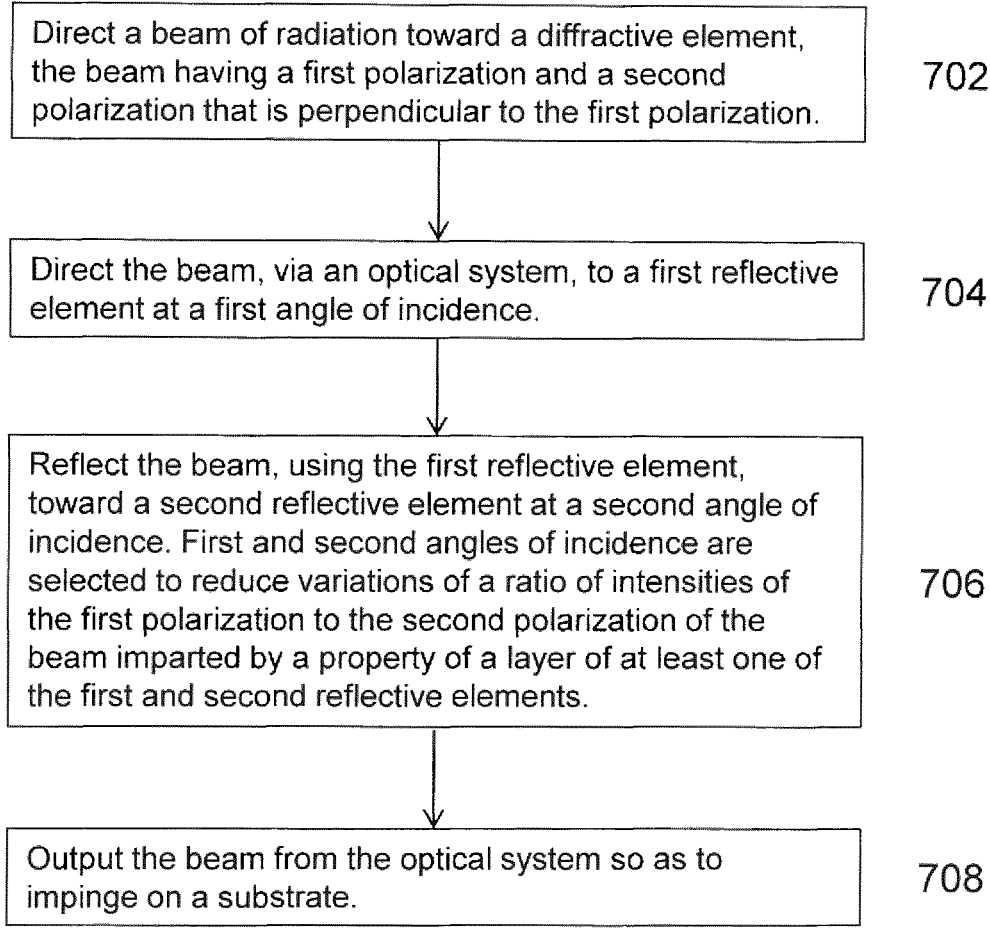
FIG. 7 shows method steps for reducing sensitivity of a level sensor to variations of a property of an optical component in the level sensor, according to some embodiments.

FIG. 7 shows method steps for reducing sensitivity of a level sensor, arranged to measure a height of a substrate, to variations of a property of an optical component in the level sensor, according to some embodiments. In step 702, a beam of radiation is directed toward a diffractive element. The beam comprises a first polarization and a second polarization that is perpendicular to the first polarization. In step 704, the beam is directed, via an optical system, to a first reflective element at a first angle of incidence. In step 706, the beam is reflected, using the first reflective element, toward a second reflective element at a second angle of incidence. The first and second angles of incidence are selected (e.g., via arrangement of the first and second reflective elements) to reduce variations of a ratio of intensities of the first polarization to the second polarization of the beam imparted by a property of a layer of at least one of the first and second reflective elements. In step 708, the beam is output from the optical system so as to impinge on a substrate.

In some embodiments, the first and second angles of incidence do not exceed approximately 45 degrees. In some embodiments, the first angle of incidence is between approximately 30 to 45 degrees. In some embodiments, the first angle of incidence is between approximately 10 to 30 degrees. In some embodiments, the second angle of incidence is between approximately 30 to 45 degrees. In some embodiments, the second angle of incidence is between approximately 10 to 30 degrees. In some embodiments, the first and second angles of incidence are the same or substantially similar. In some embodiments, the first and second reflective elements are arranged such that the beam received by the first reflective element crosses the beam reflected by the second reflective element. In this scenario, the sum of the first and second angles of incidence is less than 90 degrees. In an alternative description, the first and second reflective elements are arranged such that the beam received by the first reflective element is folded onto the beam reflected by the second reflective element.

In some embodiments, the optical system comprises third, fourth, and fifth mirrors. The diffractive element is configured to direct the beam toward the third reflective element. The third reflective element is configured to reflect the beam from the diffractive element toward the fourth reflective element. The fourth reflective element is configured to reflect the beam from the third reflective element toward the fifth reflective element, receive the beam reflected by the fifth reflective element, and reflect the beam from the fifth reflective element toward the first reflective element at the first angle of incidence.

In some embodiments, the property of the layer comprises a thickness of the layer and/or at least one dielectric property of the layer (e.g., permittivity, refractive index, atomic composition, and the like).

Figure 8:
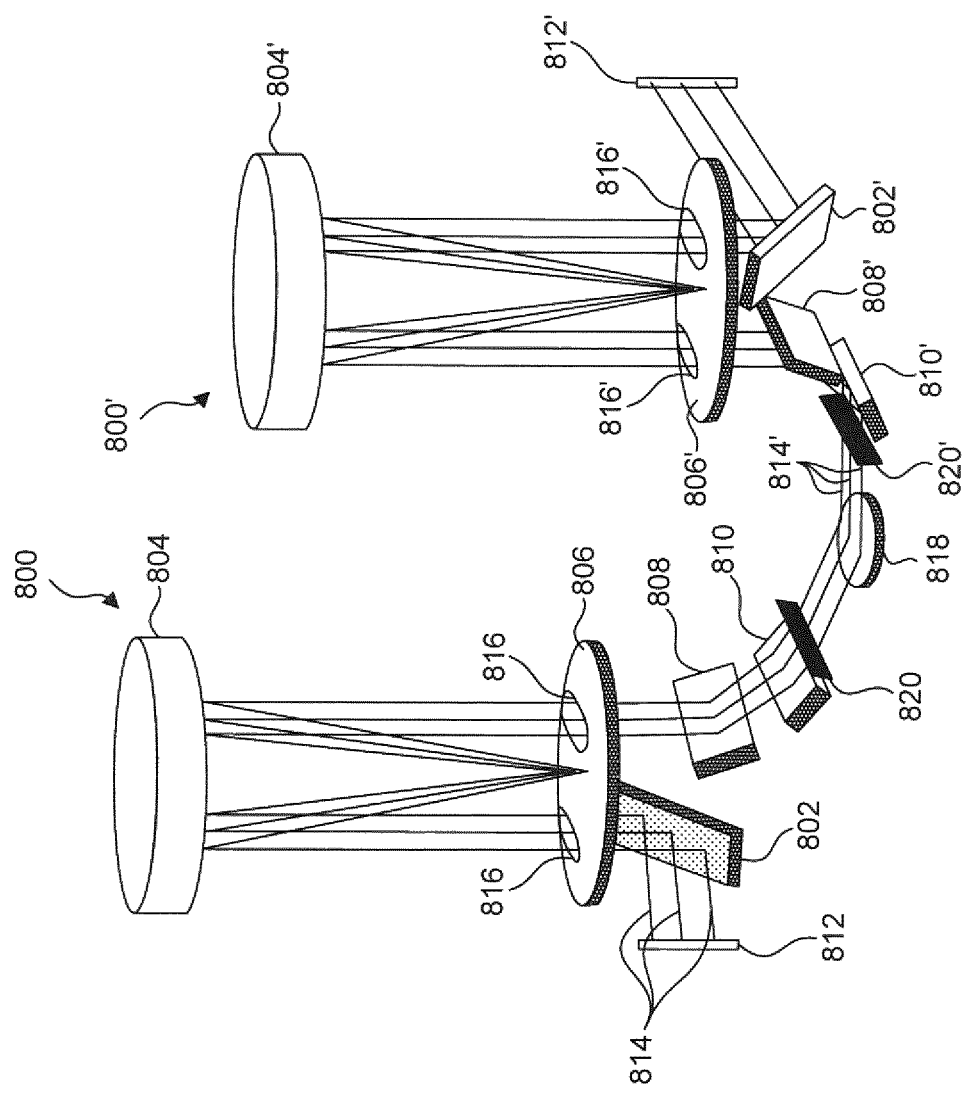
FIG. 8 shows a perspective schematic of two optical systems respectively configured for illumination sourcing and detection, according to some embodiments.

FIG. 8 shows a perspective schematic of optical system 800 and optical system 800' respectively configured for illumination sourcing and detection, according to some embodiments. The element of optical system 800 are functionally and structurally similar to those in FIGS. 5 and 6 with like reference numbers, with the left-most digits of a reference number identifying the drawing in which the reference number appears. In some embodiments, optical system 800' comprises elements corresponding to similarly numbered elements of optical system 800. The arrangement shown in FIG. 8 illustrates optical system 800' as a copy of optical system 800 and rotated 180 degrees. In some embodiments, optical system 800' is arranged as a mirror copy of optical system 800.

In some embodiments, a beam of radiation 814' that has been reflected by a substrate 818 impinges on mirror 810' as beam of radiation 814' is input into optical system 800'. Mirror 810 and mirror 810' need not be the optical elements most proximate to substrate 818. Beam of radiation 814' then travels through optical system 800' in a direction that corresponds to the reverse of a beam of radiation 814 through optical system 800.

In some embodiments, an optical element 820 (e.g., polarization rotator, grating, waveplates, multiple optical elements, and the like) can be disposed between mirror 810 and substrate 818. An optical element 820' can be disposed between mirror 810' and substrate 818. Though the arrangements of mirror 808, mirror 810, mirror 808', and mirror 810' are shown being similar to mirror 508 and mirror 510 (FIG. 5), a skilled artisan will appreciate that mirror 808, mirror 810, mirror 808', and mirror 810' can also be arranged similar to mirror 608 and mirror 610 (FIG. 6).

The embodiments may further be described using the following clauses:

1. A method to reduce sensitivity of a level sensor, arranged to measure a height of a substrate, to variations of a property of an optical component in the level sensor, the method comprising:

directing a beam of radiation toward a diffractive element, the beam having a first polarization and a second polarization that is perpendicular to the first polarization; and directing the beam, via an optical system, to a first reflective element at a first angle of incidence, wherein the first reflective element reflects the beam toward a second reflective element at a second angle of incidence so as to cause the beam to impinge on the substrate, and wherein the first and second angles of incidence are selected to reduce variations of a ratio of intensities of the first polarization to the second polarization of the beam imparted by a property of a layer of at least one of the first and second reflective elements.

2. The method of clause 1, wherein the first and second angles of incidence do not exceed approximately 45 degrees.

3. The method of clause 1, wherein the first and second angles of incidence are between approximately 10 degrees to 30 degrees.

4. The method of clause 1, wherein the first and second reflective elements are configured such that the beam received by the first reflective element crosses the beam reflected by the second reflective element.

5. The method of clause 1, wherein:

the optical system comprises third, fourth, and fifth mirrors;

the diffractive element is configured to direct the beam toward the third reflective element;

the third reflective element is configured to reflect the beam from the diffractive element toward the fourth reflective element; and the fourth reflective element is configured to reflect the beam from the third reflective element toward the fifth reflective element, receive the beam reflected by the fifth reflective element, and reflect the beam from the fifth reflective element toward the first reflective element at the first angle of incidence.

6. The method of clause 1, wherein the property of the layer comprises a thickness of the layer.

7. The method of clause 1, wherein the property of the layer comprises a dielectric property comprising permittivity, refractive index, and/or atomic composition of the layer.

8. An optical system for directing a beam of radiation having a first polarization and a second polarization that is perpendicular to the first polarization, the optical system comprising:

a diffractive element; and first and second reflective elements;

wherein the diffractive element is configured to direct the beam in the optical system so as to cause the beam to impinge on the first reflective element at a first angle of incidence, wherein the first reflective element is configured to reflect the beam toward the second reflective element at a second angle of incidence so as to cause the beam to impinge on a substrate, and wherein the first and second angles of incidence are selected to reduce variations of a ratio of intensities of the first polarization to the second polarization of the beam imparted by a property of a layer of at least one of the first and second reflective elements.

9. The optical system of clause 8, wherein the first and second angles of incidence do not exceed approximately 45 degrees.

10. The optical system of clause 8, wherein the first and second angles of incidence are between approximately 10 degrees to 30 degrees.

11. The optical system of clause 8, wherein the first and second reflective elements are configured such that the beam received by the first reflective element crosses the beam reflected by the second reflective element.

12. The optical system of clause 8, further comprising third, fourth, and fifth mirrors, wherein:

the diffractive element is configured to direct the beam toward the third reflective element;

the third reflective element is configured to reflect the beam from the diffractive element toward the fourth reflective element; and the fourth reflective element is configured to reflect the beam from the third reflective element toward the fifth reflective element, receive the beam reflected by the fifth reflective element, and reflect the beam from the fifth reflective element toward the first reflective element at the first angle of incidence.

13. The optical system of clause 8, wherein the property of the layer comprises a thickness of the layer.

14. The optical system of clause 8, wherein the property of the layer comprises a dielectric property comprising permittivity, refractive index, and/or atomic composition of the layer.

15. A metrology system comprising:

a radiation source configured to generate a beam of radiation having a first polarization and a second polarization that is perpendicular to the first polarization;

an optical system configured to direct the beam of radiation toward a substrate, the optical system comprising:

a diffractive element;

first and second reflective elements;

wherein the diffractive element is configured to direct the beam in the optical system so as to cause the beam to impinge on the first reflective element at a first angle of incidence, wherein the first reflective element is configured to reflect the beam toward the second reflective element at a second angle of incidence so as to cause the beam to impinge on the substrate, and wherein the first and second angles of incidence are selected to reduce variations of a ratio of intensities of the first polarization to the second polarization of the beam imparted by a property of a layer of at least one of the first and second reflective elements; and a detector configured to receive radiation scattered by the substrate and generate a signal based on the received radiation, wherein the signal comprises information of a height of the substrate.

16. The metrology system of clause 15, wherein the first and second angles of incidence do not exceed approximately 45 degrees.

17. The metrology system of clause 15, wherein the first and second angles of incidence are between approximately 10 degrees to 30 degrees.

18. The metrology system of clause 15, wherein the first and second reflective elements are configured such that the beam received by the first reflective element crosses the beam reflected by the second reflective element.

19. The metrology system of clause 15, further comprising third, fourth, and fifth mirrors, wherein:

the diffractive element is configured to direct the beam toward the third reflective element;

the third reflective element is configured to reflect the beam from the diffractive element toward the fourth reflective element; and the fourth reflective element is configured to reflect the beam from the third reflective element toward the fifth reflective element, receive the beam reflected by the fifth reflective element, and reflect the beam from the fifth reflective element toward the first reflective element at the first angle of incidence.

20. The metrology system of clause 15, wherein the property of the layer comprises a thickness of the layer, permittivity, refractive index, and/or atomic composition of the layer.

Although specific reference can be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, LCDs, thin-film magnetic heads, etc. The skilled artisan will appreciate that, in the context of such alternative applications, any use of the terms "wafer" or "die" herein can be considered as synonymous with the more general terms "substrate" or "target portion", respectively. The substrate referred to herein can be processed, before or after exposure, in for example a track unit (a tool that typically applies a layer of resist to a substrate and develops the exposed resist), a metrology unit and/or an inspection unit. Where applicable, the disclosure herein can be applied to such and other substrate processing tools. Further, the substrate can be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention can be used in other applications, for example imprint lithography, and where the context allows, is not limited to optical lithography. In imprint lithography a topography in a patterning device defines the pattern created on a substrate. The topography of the patterning device can be pressed into a layer of resist supplied to the substrate whereupon the resist is cured by applying electromagnetic radiation, heat, pressure or a combination thereof. The patterning device is moved out of the resist leaving a pattern in it after the resist is cured.

It is to be understood that the phraseology or terminology herein is for the purpose of description and not of limitation, such that the terminology or phraseology of the present disclosure is to be interpreted by those skilled in relevant art(s) in light of the teachings herein.

In the embodiments described herein, the terms "lens" and "lens element," where the context allows, can refer to any one or combination of various types of optical components, including refractive, reflective, magnetic, electromagnetic, and electrostatic optical components. The term "mirror" as used herein can refer to any one or combination of various types of reflective elements or optical components that direct/redirect radiation via reflection. The term "grating" as used herein can refer to any one or combination of various types of diffractive elements or optical components that direct/redirect radiation via diffraction.

Further, the terms "radiation," "beam," and "light" used herein may encompass all types of electromagnetic radiation, for example, ultraviolet (UV) radiation (for example, having a wavelength λ of 365, 248, 193, 157 or 126 nm), extreme ultraviolet (EUV or soft X-ray) radiation (for example, having a wavelength in the range of 5-20 nm such as, for example, 13.5 nm), or hard X-ray working at less than 5 nm, as well as particle beams, such as ion beams or electron beams. Generally, radiation having wavelengths between about 400 to about 700 nm is considered visible radiation; radiation having wavelengths between about 780-3000 nm (or larger) is considered IR radiation. UV refers to radiation with wavelengths of approximately 100-400 nm. Within lithography, the term "UV" also applies to the wavelengths that can be produced by a mercury discharge lamp: G-line 436 nm; H-line 405 nm; and/or, I-line 365 nm. Vacuum UV, or VUV (i.e., UV absorbed by gas), refers to radiation having a wavelength of approximately 100-200 nm. Deep UV (DUV) generally refers to radiation having wavelengths ranging from 126 nm to 428 nm, and in some embodiments, an excimer laser can generate DUV radiation used within a lithographic apparatus. It should be appreciated that radiation having a wavelength in the range of, for example, 5-20 nm relates to radiation with a certain wavelength band, of which at least part is in the range of 5-20 nm.

The term "substrate" as used herein may describe a material onto which material layers are added. In some embodiments, the substrate itself can be patterned and materials added on top of it may also be patterned, or may remain without patterning.

Although specific reference can be made in this text to the use of the apparatus and/or system according to the invention in the manufacture of ICs, it should be explicitly understood that such an apparatus and/or system has many other possible applications. For example, it can be employed in the manufacture of integrated optical systems, guidance and detection patterns for magnetic domain memories, LCD panels, thin-film magnetic heads, etc. The skilled artisan will appreciate that, in the context of such alternative applications, any use of the terms "reticle," "wafer," or "die" in this text should be considered as being replaced by the more general terms "mask," "substrate," and "target portion," respectively.

While specific embodiments of the invention have been described above, it will be appreciated that the invention can be practiced otherwise than as described. The description is not intended to limit the invention.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein.

The breadth and scope of the present invention should not be limited by any of the above-described exemplary embodiments, but should be defined only in accordance with the following claims and their equivalents.

The invention claimed is:

1. A method of operating a metrology system comprising a diffractive element, first and second mirrors, and first and second reflective elements, the method comprising:
    directing a beam of radiation toward the diffractive element, the beam having a first polarization and a second polarization that is perpendicular to the first polarization, wherein the beam then passes through a first opening in the first mirror;
    directing the beam toward the second mirror then through a second hole in the first mirror to the first reflective element at a first angle of incidence;
    reflecting the beam from the first reflective element toward the second reflective element at a second angle of incidence; and
    reflecting the beam from the second reflective element toward a substrate, wherein the first and second angles of incidence are configured to reduce a variation of a ratio of intensities of the first polarization to the second polarization, the variation being based on a property of a layer of the first and/or second reflective elements.

2. The method of claim 1, wherein the first and second angles of incidence do not exceed approximately 45 degrees.

3. The method of claim 1, wherein the first and second angles of incidence are between approximately 10 degrees to 30 degrees.

4. The method of claim 1, wherein the first and second reflective elements are configured such that the beam received by the first reflective element crosses the beam reflected by the second reflective element.

5. The method of claim 1,
    further comprising measuring a height position of the substrate using the metrology system.

6. The method of claim 1, wherein the variation of the ratio of intensities of the first polarization to the second polarization is based on a thickness of the layer.

7. The method of claim 1, wherein the variation of the ratio of intensities of the first polarization to the second polarization is based on a dielectric property of the layer.

8. An optical system for directing a beam of radiation having a first polarization and a second polarization that is perpendicular to the first polarization, the optical system comprising:
    a diffractive element;
    first and second mirrors; and
    first and second reflective elements,
    wherein:
    the diffractive element is configured to direct the beam toward the second mirror through a first opening in the first mirror and then through a second hole in the first mirror toward the first reflective element at a first angle of incidence,
    the first reflective element is configured to reflect the beam toward the second reflective element at a second angle of incidence,
    the second reflective element is configured to reflect the beam toward a substrate, and
    the first and second angles of incidence are configured to reduce a variation of a ratio of intensities of the first polarization to the second polarization, the variation being based on a property of a layer of the first and/or second reflective elements.

9. The optical system of claim 8, wherein the first and second angles of incidence do not exceed approximately 45 degrees.

10. The optical system of claim 8, wherein the first and second angles of incidence are between approximately 10 degrees to 30 degrees.

11. The optical system of claim 8, wherein the first and second reflective elements are configured such that the beam received by the first reflective element crosses the beam reflected by the second reflective element.

12. The optical system of claim 8, further comprising third, fourth, and fifth reflective elements, wherein:
    the diffractive element is further configured to direct the beam toward the third reflective element;
    the third reflective element is configured to reflect the beam toward the fourth reflective element;
    the fourth reflective element is configured to reflect the beam toward the fifth reflective element; and
    the fifth reflective element is configured to reflect the beam toward the first reflective element at the first angle of incidence.

13. The optical system of claim 8, wherein the variation of the ratio of intensities of the first polarization to the second polarization is based on a thickness of the layer.

14. The optical system of claim 8, wherein the variation of the ratio of intensities of the first polarization to the second polarization is based on a dielectric property of the layer.

15. A metrology system comprising:
    a radiation source configured to generate a beam of radiation having a first polarization and a second polarization that is perpendicular to the first polarization;
    an optical system configured to direct the beam of radiation toward a substrate, the optical system comprising:
    a diffractive element;
    first and second mirrors; and
    first and second reflective elements,
    wherein:
    the diffractive element is configured to direct the beam toward the second mirror through a first opening in the first mirror and then through a second hole in the first mirror downstream toward the first reflective element at a first angle of incidence elements,
    the first reflective element is configured to reflect the beam toward the second reflective element at a second angle of incidence,
    the second reflective element is configured to reflect the beam toward the substrate, and
    the first and second angles of incidence are configured to reduce a variation of a ratio of intensities of the first polarization to the second polarization, the variation being based on a property of a layer of the first and/or second reflective elements; and a detector configured to receive radiation scattered by the substrate and generate a signal based on the received radiation, wherein the signal comprises information of a height position of the substrate.

16. The metrology system of claim 15, wherein the first and second angles of incidence do not exceed approximately 45 degrees.

17. The metrology system of claim 15, wherein the first and second angles of incidence are between approximately 10 degrees to 30 degrees.

18. The metrology system of claim 15, wherein the first and second reflective elements are configured such that the beam received by the first reflective element crosses the beam reflected by the second reflective element.

19. The metrology system of claim 15, further comprising third, fourth, and fifth reflective elements, wherein:
the diffractive element is further configured to direct the beam toward the third reflective element;
the third reflective element is configured to reflect the beam toward the fourth reflective element;
the fourth reflective element is configured to reflect the beam toward the fifth reflective element; and
the fifth reflective element is configured to reflect the beam toward the first reflective element at the first angle of incidence.

20. The metrology system of claim 15, wherein the variation of the ratio of intensities of the first polarization to the second polarization is based on a thickness and/or a dielectric property of the layer.

* * * * *

UNITED STATES PATENT AND TRADEMARK OFFICE
CERTIFICATE OF CORRECTION

| | |
|---|---|
| PATENT NO. | : 11,537,055 B2 |
| APPLICATION NO. | : 17/438328 |
| DATED | : December 27, 2022 |
| INVENTOR(S) | : Smirnov |

It is certified that error appears in the above-identified patent and that said Letters Patent is hereby corrected as shown below:

In the Claims

In Column 20, Claim 15, Line 57, delete "incidence elements," and insert -- incidence, --, therefor.

Signed and Sealed this
Fifth Day of November, 2024

Katherine Kelly Vidal
*Director of the United States Patent and Trademark Office*